United States Patent [19]

Yamane et al.

[11] Patent Number: 4,916,828
[45] Date of Patent: Apr. 17, 1990

[54] METHOD OF PRODUCING SATURATED VAPOR OF SOLID METAL ORGANIC COMPOUNDS IN THE METAL ORGANIC CHEMICAL VAPOR DEPOSITION METHOD

[75] Inventors: Akira Yamane, Kudamatsu; Masao Fujisawa, Houfu, both of Japan

[73] Assignee: Tosoh Akzo Corporation, Tokyo, Japan

[21] Appl. No.: 375,683

[22] Filed: Jul. 5, 1989

[30] Foreign Application Priority Data

Aug. 31, 1988 [JP] Japan ................................. 63-215155

[51] Int. Cl.$^4$ ............................................. C30B 25/14
[52] U.S. Cl. ............................................. 34/10; 34/22; 34/57 A; 422/306; 137/268
[58] Field of Search ............... 137/1, 268; 422/305, 422/306; 34/22, 36, 42, 57 A, 57 R, 10

[56] References Cited

U.S. PATENT DOCUMENTS 3,734,999  4/1988  Fujisawa ........................ 34/57 A

FOREIGN PATENT DOCUMENTS 59-151699  8/1984  Japan .
62-46639   3/1987  Japan .
62-83400   4/1987  Japan .
63-11598   1/1988  Japan .
63-55194   3/1988  Japan .

Primary Examiner—Alan Cohan
Attorney, Agent, or Firm—Oblon, Spivak, McClelland, Maier & Neustadt

[57] ABSTRACT

A method of producing saturated vapor of solid metal organic compounds in the metal organic chemical vapor deposition method is disclosed, which is characterized in that, into a cylinder for metal organic chemical vapor deposition having a structure that an introducing port and a discharging port of carrier gas are provided respectively to the cylinder for metal organic chemical vapor deposition and a tube directly connected to either of these is inserted into the cylinder, a solid metal organic compound and a packing material are charged and a carrier gas fed from introducing port into cylinder is discharged from discharging port to outside of cylinder.

1 Claim, 4 Drawing Sheets

METHOD OF PRODUCING SATURATED VAPOR OF SOLID METAL ORGANIC COMPOUNDS IN THE METAL ORGANIC CHEMICAL VAPOR DEPOSITION METHOD

BACKGROUND OF THE INVENTION

The present invention relates to a method of producing saturated vapor of solid metal organic compounds in the metal organic chemical vapor deposition (MO-CVD) method of semiconductor metal organic compounds.

Today, as a method capable of mass-producing semiconductor laser etc. in good efficiency upon manufacturing them, the MO-CVD method using metal organic compounds is well-known. Also, the MO-CVD method is applied to the manufacture of oxide type superconducting thin film.

The MO-CVD method is a method wherein the metal organic compound is contacted with the carrier gas such as inert gas, hydrogen gas or the like, they are fed onto a wafer being under high temperature as a saturated vapor of metal organic compound and are allowed to react with raw material gas on the wafer to deposit a thin film of single crystal of compound produced through said reaction. In more detail, this is a method to deposit a thin film of single crystal of, for example, GaAs by allowing $(CH_3)_3Ga$ to react with $AsH_3$ gas on the wafer being under high temperature through following reaction equation.

In the MO-CVD method, the metal organic compound charged in a cylinder is carried with carrier gas into a reaction furnace to deposit the crystal.

As a prior art, there is a proposal of cylinder for MO-CVD method disclosed in Japanese Unexamined Patent Publication No. Sho 63-11598. Here, as shown in FIG. 3, a disperser (filter) (4) is attached to the lower part of carrier gas-introducing pipe (3) being connected to an inlet pipe (1) of carrier gas and passing the center axis of a cylinder (2), the lower part (2-1) of the cylinder (2) is made to be a narrow diameter part, the inner diameter being narrower compared with the upper part (2-2) of the cylinder, and yet, a tilting part (2-3) is provided onto said narrow diameter part so that the carrier gas introduced from the introducing pipe (3) to the bottom of cylinder (2) via the disperser (4) is saturated with the vapor of metal organic compound during rising the inside of cylinder (2) charged with metal organic compound and discharged from a discharging port (5) to outside of cylinder. According to said proposal, the effect was seen at the time of, in particular, solid metal organic compound, but it proved to be still insufficient.

In said proposal, trimethyl indium (TMIn) is used as a metal organic compound and the supply level of TMIn is determined by discontinuously varying the charge level within a range of 5 to 50 g.

With this method, the charge state of TMIn before starting of supply test is very good for each level of TMIn and, since the flow rate of carrier gas is not so high and yet the time is relatively short being 3 hours, the charge state of TMIn after finishing of supply test hardly changes as the examples in said proposal show. Thereby, it is understood that the contact of TMIn with carrier gas is sufficient to easily reach the saturation resulting in a constant value of supply level.

However, when conducting the supply test adapted to the practical use method, i.e. when charging a fixed quantity of TMIn in the cylinder and flowing the carrier gas continuously for a long period of time, such a drawback has become evident that TMIn around the filter becomes hollow with the lapse of time producing flow paths of gas and the contact of TMIn with carrier gas becomes insufficient gradually resulting in a gradual decrease in the supply level and more difficult composition control of thin film of single crystal, though the change of charge state is hardly seen during a relatively short time as described above.

There, as a result of extensive investigations for further improvement, the inventors have found that, by providing an introducing port and a discharging port of carrier gas respectively to the cylinder and by feeding the carrier gas from introducing port into cylinder and discharging it from discharging port after the solid metal organic compound and the packing material are charged in the cylinder, into which a tube directly connected to either of those is inserted, very good results can be obtained even when the flow rate of carrier gas is high, leading to the completion of the invention.

SUMMARY OF THE INVENTION

The gist of the invention lies in a method of producing saturated vapor of solid metal organic compounds in the metal organic chemical vapor deposition method characterized in that, into a cylinder for metal organic chemical vapor deposition having a structure that an introducing port and a discharging port of carrier gas are provided respectively to the cylinder for metal organic chemical vapor deposition and a tube directly connected to either of these is inserted into the cylinder, a solid metal organic compound and a packing material are charged and a carrier gas fed from introducing port into :cylinder is discharged from discharging port to outside of cylinder, and thereby the anticipated purpose has been achieved.

DETAILED DESCRIPTION OF THE INVENTION

Figure 1:
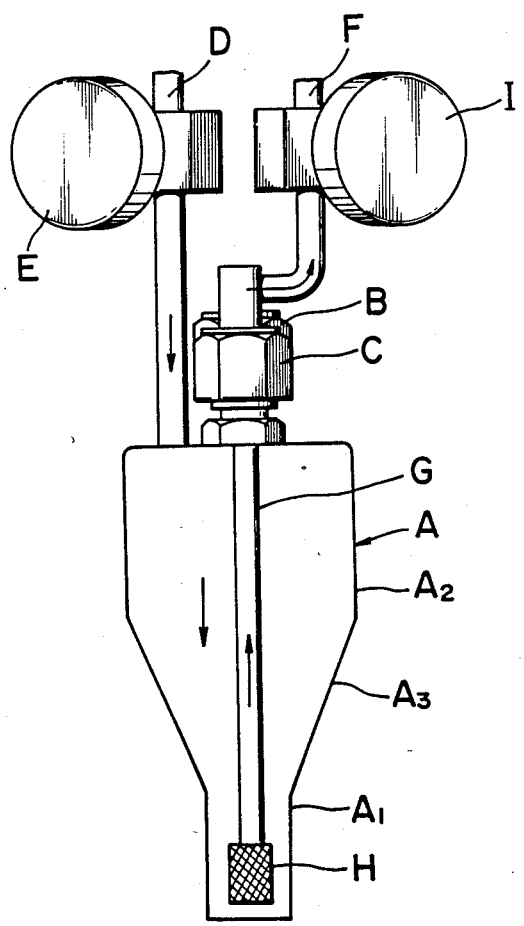
FIG. 1 is a front view for the illustration of a cylinder for metal organic chemical vapor deposition used for the method of the invention.

The shape of the cylinder to be used for the invention may be any of cylinder, horizontal type cylinder and angular type pillar, but preferably it is a vertical type cylinder. The inner diameter thereof may be either that both upper part and lower part of cylinder have same diameters or that lower part is made to be a narrow diameter part, the inner diameter being narrower compared with upper part of cylinder, and also a tilting part may safely be provided onto said narrow diameter part, but preferably the lower part is better to be narrowed. The inner diameter of cylinder is not particularly restricted and is generally 30 to 150 mm. The introducing port and the discharging port of carrier gas and the charging port to be attached to cylinder may be at any of upper part, side part and lower part of said cylinder, but the upper part is preferable. Moreover, the flow path of carrier gas may be either that carrier gas is introduced into cylinder via the tube directly connected to the introducing port of carrier gas and it is discharged from the discharging port after allowed to contact with the solid metal organic compound or that the tube is reformed to be directly connected to discharging port instead of introducing port and the carrier gas introduced into cylinder is discharged from discharging port via the tube after allowed to contact with the solid metal organic compound. Furthermore, the position of tube to be inserted into the cylinder is preferable to be at the center. Besides, the ratio of the inner diameter of tube to that of cylinder is not particularly restricted, but the linear velocity of carrier gas in cylinder is preferable to be slower.

The packing materials to be used for the invention are various packings for distillation being spherical, angular, cylindrical, columnar, coil-like, spring-like, etc. in the shape thereof, for example, Dickson packing, Helipack, Fenske, etc., various fibrous packings, various bowls, and the like, and materially shape memory alloy, glass, stainless steel, ceramics, Teflon, etc. are used, but anything may be usable if not contaminating the metal organic compound. Moreover, the size thereof is ordinarily 0.5 to 20 mm, but it may be safe if possible to enter from charging port into cylinder.

With respect to the packing method of metal organic compound into cylinder, if taking TMIn as an example, there is a method to pack after mixed beforehand a proper quantity of packing material with a fixed quantity of TMIn, a method to directly pack the packing material and TMIn alternately at an arbitrary rate, a method to pack first the packing material and then TMIn and to rotate the cylinder, or the like, but the uniform dispersion of TMIn and packing material in the cylinder would exert greater effect of the invention.

As a shape of TMIn to be submitted to packing, either granular product obtainable by disintegrating the mass or needle-like product obtainable through sublimation may be used. Moreover, the rate of packing material to TMIn is preferable to be 20 to 80% at a volume ratio.

To the tip of tube directly connected to the introducing port or discharging port of carrier gas to be used for the invention, the disperser (filter) may be equipped or not equipped, but preferably it is better to be equipped and the shape thereof is columnar, dish-like, plate-like, spherical or the like. In this case, the tip of tube may be either in a protruded shape or in a receded shape into the disperser. The point is that carrier gas has only to flow via the disperser. Furthermore, the disperser has only to be porous and materially stainless steel or even one made of ceramic may be safely used if having durability and approximately uniform fineness of 1 to 100μ.

As the solid state metal organic compounds effectively utilizable the invention, there are alkyl metal compounds, cyclopentadienyl compounds, β-diketone complexes, etc. Concretely, trimethyl indium, triphenyl aluminum, triphenyl bismuth, tertbutyl lithium, cyclopentadienyl indium, cyclopentadienyl lithium, cyclopentadienyl magnesium, cyclopentadienyl manganese, tritolyl bismuth, barium acetylacetonate complex, strontium acetylacetonate complex, copper acetylacetonate complex, yttrium acetylacetonate complex, calcium acetylacetonate complex, barium dipivaloylmethanate, strontium dipivaloylmethanate, copper dipivaloylmethanate, yttrium dipivaloylmethanate, calcium dipivaloylmethanate, etc. can be mentioned. Moreover, the pressure in the cylinder at the time of use may be any state of pressurized, normal and reduced. Besides, there are inert gases such as nitrogen, argon, helium, etc. or hydrogen gas as the carrier gases, but generally hydrogen gas is used.

Figure 3:
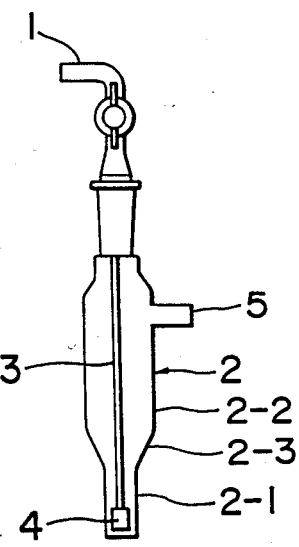
FIG. 3 is a front view for the illustration of a cylinder of conventional example.

The cylinder disclosed in Japanese Unexamined Patent Publication No. Sho 63-11598 were illustrated in FIG. 3. When placing TMIn in this cylinder made of glass and introducing continuously the nitrogen gas at a rate of 500 ml/min, the cavities were observed around the filter at a point of time when the use level of TMIn reached about 5%, and the supply level began to decrease.

There, as a result of various tests, it was found that, when testing by the method of the invention, equal quantity of gas was well obtained for long hours and a fixed thin film of single crystal was produced on the wafer.

This would be from the reason that the packing material becomes resistant to the flow of carrier gas and yet, because of the voids between the packing materials, the cavitation of TMIn is difficult to progress.

Besides, with respect to the temperature for the use of solid state metal organic compound, this may be safe if being under the melting point of solid state metal organic compound and, for example, it is under 88° C. in the case of TMIn and under 78° C. in the case of triphenyl bismuth.

In following, the invention will be illustrated concretely based on the examples, but it is not confined to these.

EXAMPLE 1

Figure 2:
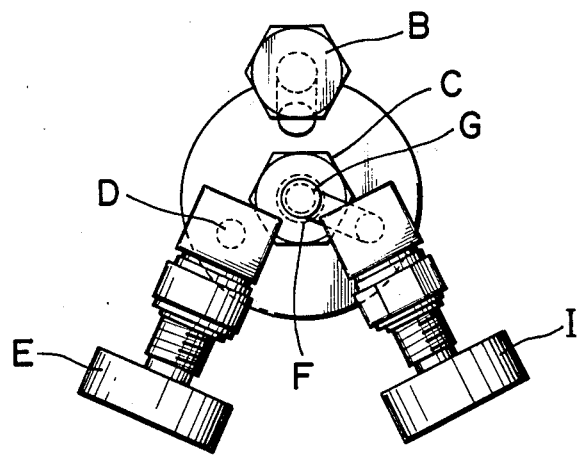
FIG. 2 is a ground plan for the illustration of the same cylinder.

FIG. 1 and FIG. 2 shows an example of cylinder for the metal organic chemical vapor deposition used for the method of the invention. At the circular circumference of the upper part of a vertical type cylindrical cylinder (A), there are a throwing-in port (B) of metal organic compound for charging the metal organic compound and the packing material into the cylinder (A) and an introducing pipe (D) of carrier gas rising perpendicularly from the introducing port of carrier gas. The carrier gas is introduced from this introducing pipe (D) into the cylinder (A) via a cock (E). Also, at the circular center thereof, a discharging pipe (F) of carrier gas bending from the upper part of cylinder (A) toward the circular circumference thereof and then rising is directly connected to a tube (G). This tube (G) is inserted from the upper part to near the bottom of cylinder (A) piercing the center thereof and, to the lower end of the tube (G), a disperser (filter) (H) is provided. Thereby, the carrier gas passing the inside of cylinder (A) charged with metal organic compound and packing material and containing the saturated vapor of metal organic compound rises in the tube (G) via the disperser (H) and passes the discharging pipe (F) to be discharged outside via the cock (I).

Figure 4:
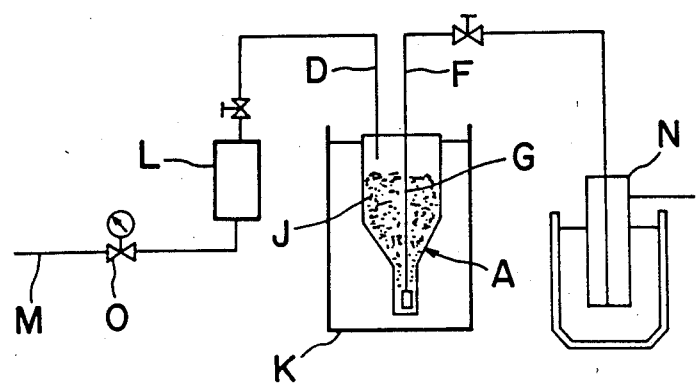
FIG. 4 is a systematic diagram for the illustration of a test device assembled the cylinder in FIG. 1.

There, as shown in FIG. 4, 26.0 g of TMIn and 50 ml of glass Helipack G3 [4 mm×4 mm×3 mm, made by Taika Kogyo Co., Ltd.] (J) were charged respectively into said cylinder (A) (diameter of cylinder: 40 mm) and they were mixed by rotating the cylinder. Then, this was dipped into a thermostatic bath (K) of 25° C. and a hydrogen gas line (M) provided with a flow controller (L) was connected to the introducing pipe (D) of carrier gas to introduce continuously the hydrogen gas for 8 hours at a rate of 500 ml/min and to discharge the gas of TMIn. TMIn in the hydrogen gas was collected by a trap (N) of liquid nitrogen and determined from the change of weight thereof. After the determination, the hydrogen gas was flown again for same hours at same flow rate and this procedure was repeated until TMIn did not appear. The results of determination are shown in FIG. 5.

Figure 5:
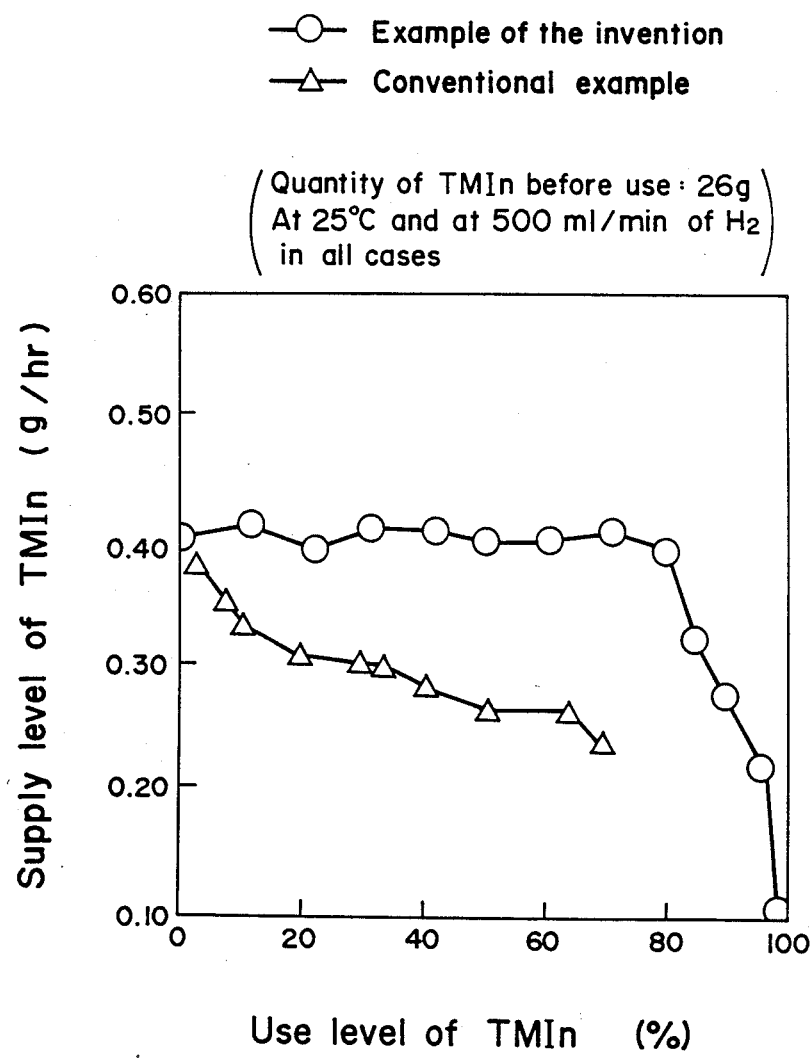
FIG. 5 is a chart showing the results of comparative tests between the cylinder of the example of the invention and that of conventional example, which were conducted by using the test device in FIG. 4.

The supply level (g/hr) of TMIn on the ordinate of FIG. 5 means a generated quantity of gas of TMIn obtainable by allowing TMIn to contact with carrier gas.

CONVENTIONAL EXAMPLE 1

Using a cylinder shown in FIG. 3, 26.0 g of TMIn were charged into the cylinder (2) and the hydrogen gas was flown at a rate of 500 ml/min according to the example. TMIn in the hydrogen gas was collected by the same method as in Example 1 and the change over time of supply level was determined. At this time, the supply level was decreased with an enlargement of cavities. Results are shown in FIG. 5.

EXAMPLE 2

The supply test was conducted under entirely same conditions as in Example 1 except that the packing material used in Example 1 was replaced with 40 ml of stainless steel Dickson packing [6.0 mm, made by Naniwa Tokushu Kanaami Co., Ltd.]. The supply level of TMIn was not decreased at all until the use level of TMIn reached 82%.

EXAMPLE 3

The TMIn gas was discharged from the discharging port under same conditions as in Example 1 except that the lower part of tube used in Example 1 and directly connected to the discharging port of cylinder was bent so as the tip thereof to be positioned at the bottom of cylinder and the tube was changed to be directly connected to the introducing port of carrier gas. The results were same as shown in FIG. 5 and the supply level was not decreased until about 80%.

EXAMPLE 4

Into a cylindrical cylinder with an inner diameter of 70 mm, to the bottom of which a tube with an inner diameter of 10 mm directly connected to the introducing port of carrier gas is inserted without the disperser equipped at the tip thereof and which has a discharging port at the upper part of cylinder, 55 g of TMIn and 150 ml of stainless steel Helipack No. 4 (trade name: Naniwa pack) [2.5 mm×5.0 mm×5.0 mm, made by Naniwa Tokusyu Kanaami Co., Ltd.] were charged after mixed beforehand. The cylinder was dipped into a thermostatic bath of 60° C. and the hydrogen gas was fed continuously at a rate of 1000 ml/min until TMIn did not appear. As a result, the supply level was not decreased at all until the use level of TMIn reached 86%.

EXAMPLE 5

Into a same type cylinder as that used in Example 1, 15 g of triphenyl bismuth and 80 ml of glass Helipack G3 [4 mm×4 mm×3 mm, made by Taika Kogyo Co., Ltd.] were charged and they were mixed by shaking the cylinder. This cylinder was dipped into a thermostatic bath of 70° C. and the hydrogen gas was fed continuously so as the pressure in the cylinder to become 3 mm Hg. As a result, the supply level did not vary until the use level of triphenyl bismuth reached 91%.

CONVENTIONAL EXAMPLE 2

The supply test was conducted under entirely same conditions as in Example 5 except that the packing material was not charged in Example 5.

In consequence, the supply level was rapidly dropped from a point of time when the use level of triphenyl bismuth reached 26%.

As described, according to the method of the invention, a constant supply level of metal organic compound can be obtained stably over long hours independent of the charge level of solid metal organic compound, flow rate of carrier gas, etc. compared with the conventional method. Hence, the composition control of the thin film of signal crystal becomes possible and the industrial worth is very significant.

What is claimed is:

1. A method of producing saturated vapor of solid metal organic compounds in the metal organic chemical vapor deposition method, characterized in that, into a cylinder for metal organic chemical deposition having a structure that an introducing port and a discharging port of carrier gas are provided respectively to the cylinder for metal organic chemical vapor deposition and a tube directly connected to either of these is inserted into the cylinder, a solid metal organic compound and a packing material are charged and a carrier gas fed from introducing port into cylinder is discharged from discharging port to outside of cylinder.

* * * * *